(12) United States Patent
Xu et al.

(10) Patent No.: US 9,984,933 B1
(45) Date of Patent: May 29, 2018

(54) SILICON LINER FOR STI CMP STOP IN FINFET

(71) Applicant: GLOBALFOUNDRIES INC., Grand Cayman (KY)

(72) Inventors: Yiheng Xu, Clifton Park, NY (US); Haiting Wang, Clifton Park, NY (US); Wei Zhao, Fort Lee, NJ (US); Todd B. Abrams, Round Lake, NY (US); Jiehui Shu, Clifton Park, NY (US); Jinping Liu, Ballston Lake, NY (US); Scott Beasor, Greenwich, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/723,416

(22) Filed: Oct. 3, 2017

(51) Int. Cl.
| | |
|---|---|
| *H01L 21/311* | (2006.01) |
| *H01L 21/8234* | (2006.01) |
| *H01L 21/306* | (2006.01) |
| *H01L 29/78* | (2006.01) |
| *H01L 21/28* | (2006.01) |

(52) U.S. Cl.
CPC ........ *H01L 21/823431* (2013.01); *H01L 21/28123* (2013.01); *H01L 21/30625* (2013.01); *H01L 21/823481* (2013.01); *H01L 29/785* (2013.01)

(58) Field of Classification Search
CPC . H01L 21/28123; H01L 21/76; H01L 21/762; H01L 21/30625; H01L 21/3212; H01L 21/823431; H01L 21/823481
USPC ........ 438/696, 697, 700, 717, 724, 736, 744
See application file for complete search history.

(56) References Cited

U.S. PATENT DOCUMENTS

| | | |
|---|---|---|
| 5,545,588 A | 8/1996 | Yoo |
| 6,008,123 A | 12/1999 | Kook et al. |
| 6,165,695 A | 12/2000 | Yang et al. |
| 6,498,061 B2 | 12/2002 | Divakaruni et al. |
| 6,533,907 B2 | 3/2003 | Demaray et al. |
| 6,806,203 B2 | 10/2004 | Weidman et al. |
| 9,773,789 B1* | 9/2017 | Chen ............... H01L 27/10897 |
| 2014/0191300 A1 | 7/2014 | Jhaveri et al. |
| 2015/0014790 A1* | 1/2015 | Peng ............... H01L 21/76224 257/401 |
| 2016/0163700 A1* | 6/2016 | Peng ............... H01L 21/76224 257/401 |
| 2018/0005870 A1* | 1/2018 | Hsu ............... H01L 21/02271 |
| 2018/0012809 A1* | 1/2018 | Yin ............... H01L 27/0924 |

(Continued)

*Primary Examiner* — Binh X Tran
(74) *Attorney, Agent, or Firm* — Gibb & Riley, LLC; Francois Pagette

(57) ABSTRACT

A hardmask is patterned on a first material to leave hardmask elements. The first material is patterned into fins through the hardmask. A layer of silicon is formed on the hardmask elements and the fins in processing that forms the layer of silicon thicker on the hardmask elements relative to the fins. An isolation material is formed on the layer of silicon to leave the isolation material filling spaces between the fins. The isolation material and the layer of silicon are annealed to consume relatively thinner portions of the layer of silicon and leave the layer of silicon on the hardmask elements as silicon elements. A chemical mechanical polishing (CMP) is performed on the isolation material to make the isolation material planar with the silicon elements. A first etching agent removes the silicon elements on the hardmask elements, and a second chemical agent removes the hardmask elements.

20 Claims, 5 Drawing Sheets

(56) References Cited

U.S. PATENT DOCUMENTS

2018/0019327 A1\* 1/2018 Hsu .................. H01L 29/66803
2018/0040703 A1\* 2/2018 Chang ............... H01L 29/41791
2018/0047613 A1\* 2/2018 Zhou .................. H01L 21/7624

\* cited by examiner

SILICON LINER FOR STI CMP STOP IN FINFET

BACKGROUND

Field of the Invention

The present disclosure relates to manufacturing transistors, and more specifically, to the use of a silicon liner as a shallow trench isolation (STI) chemical mechanical polishing (CMP) stop feature in FinFET processing.

Description of Related Art

Integrated circuit devices use transistors for many different functions, and these transistors can take many different forms, from planar transistors, to transistors that use a "fin" style structure. A fin of a fin-type transistor is a thin, long, six-sided rectangle that extends from a substrate, with sides that are longer than they are wide, a top and bottom that have the same length as the sides (but that have a width that is much more narrow), and ends that are as tall from the substrate as the width of the sides, but that are only as wide as the as the top and bottom.

As such fin-type transistors are reduced in size, the nitride cap that is formed on the top of the fin becomes smaller. However, this can cause problems if chemical mechanical polishing (CMP) processes remove some of the nitride cap. For example, high-temperature annealing processes can damage the underlying fins if the nitride cap has inadvertently been removed prematurely by overpolishing.

SUMMARY

Descriptions of methods herein begin with a semiconductor material. The methods herein pattern a nitride hardmask on the semiconductor material to leave hardmask elements. Such methods perform a first material removal process to remove portions of the semiconductor material not protected by the nitride hardmask, and this patterns the semiconductor material into fins, and leaves the hardmask elements on the fins.

The methods herein also form a layer of silicon on the hardmask elements and the fins. For example, the layer of silicon can be formed in a physical vapor deposition (PVD) process, which is processing that forms the layer of silicon thicker on the hardmask elements (and relatively thinner on the sidewalls of the fins). For example, the PVD process can supply silicon as a vapor in a vacuum environment, to physically deposit the layer of silicon.

Such methods additionally form an isolation material on the layer of silicon, and this leaves the isolation material filling spaces between the fins. The methods herein then initially anneal the isolation material and the layer of silicon to consume relatively thinner portions of the layer of silicon, and this leaves the layer of silicon only on the hardmask elements, and not on the fin sidewalls, as silicon elements.

These methods perform chemical mechanical polishing (CMP) on the isolation material to make the isolation material planar with the silicon elements. During the CMP process, these methods select the chemicals for use in the CMP so that the silicon elements have a greater CMP selectivity to the isolation material relative to the CMP selectivity of the hardmask elements to the isolation material. Following the CMP, such methods apply a first etching agent to dissolve and remove the silicon elements on the hardmask elements.

The methods herein can reduce the height of (remove a portion of) the isolation material (e.g., in an etching process, etc.). The methods herein also perform a subsequent anneal with the hardmask elements in place to protect the fins, where the subsequent anneal increases the density of the isolation material. After this, these methods apply a second chemical agent to dissolve and remove the hardmask elements (the first etching agent can be different from the second chemical agent). Afterwards, such methods pattern a gate insulator and gate conductor on the fin to define a channel region of the fin where the gate insulator contacts the fin (the gate insulator is between the gate conductor and the channel region) and form source and drain regions adjacent the channel region.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, if chemical mechanical polishing (CMP) processes remove some of the nitride cap, high-temperature annealing processes can damage the underlying fins; and this problem can be more pronounced at the wafer edge. For example, during a high temperature N2 anneal (that is performed post shallow trench isolation (STI) CMP processing) exposed fins (unbounded) can undergo thermal etching process and be damaged.

The systems and methods herein address these issues by forming a cap on top of pad nitride (that is thicker than the liner on fin sidewall), using for example, physical vapor deposition (PVD) of silicon, post (after) fin formation. The cap acts as a buffer layer during STI CMP processing to protect the pad nitride hardmask on top of the fin, and this avoids fin exposure during subsequent high temperature anneals. Additionally, this cap improves pad nitride thickness uniformity by protecting the pad nitride from overpolishing, which reduces fin height variation.

Figure 5:
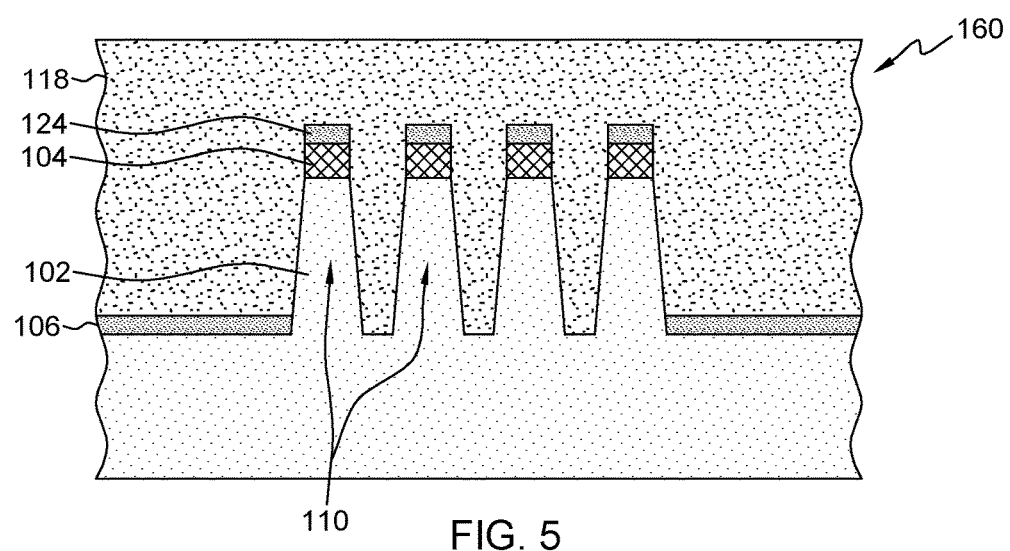
Figure 6:
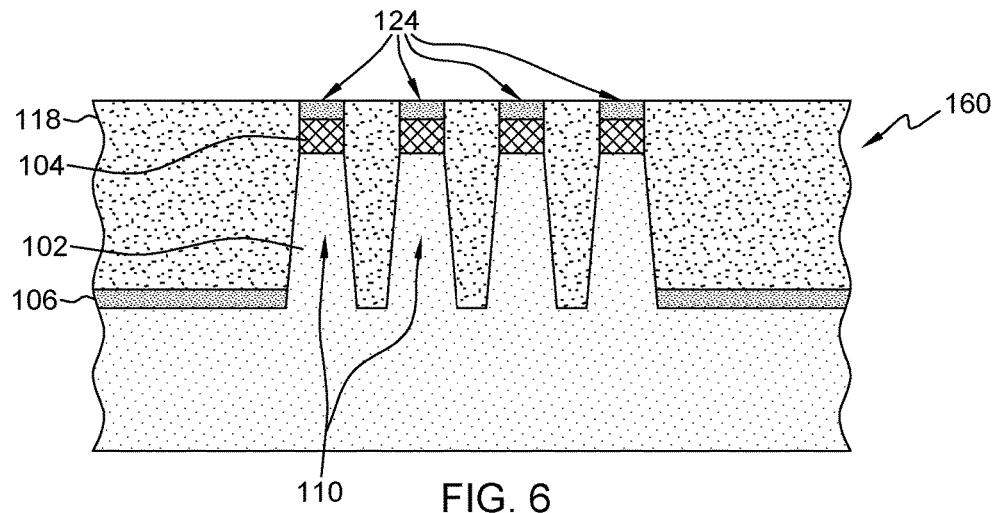
Figure 7:
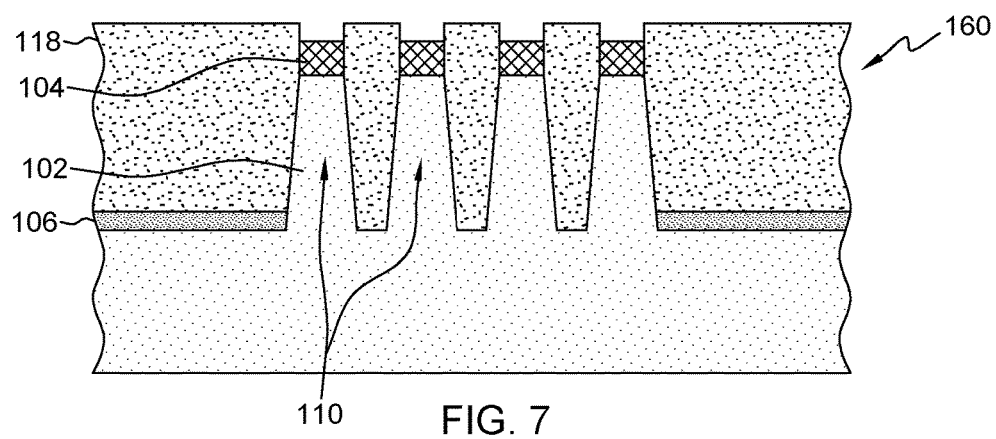
Figure 8:
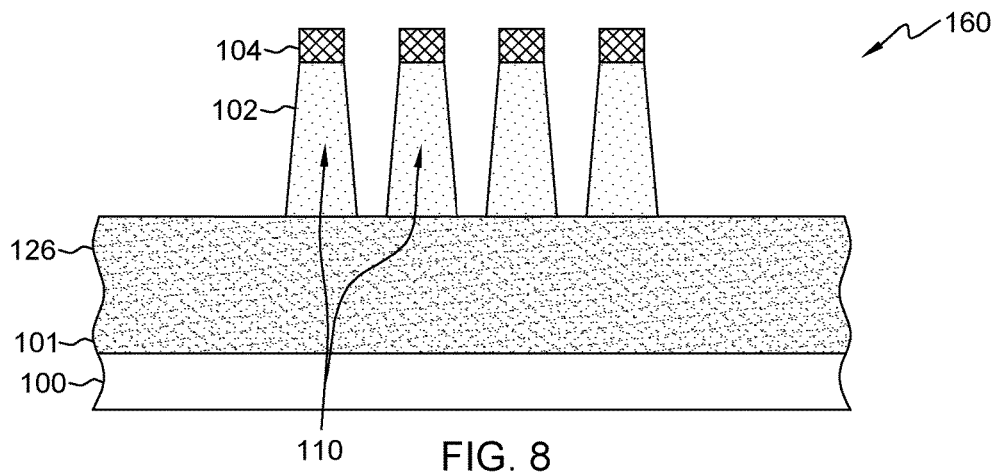

FIGS. 1-8 are cross-sectional views of partially completed devices 160 produced by methods herein, FIG. 7 is a cross-sectional view of a completed device 130, and FIG. 8 is a perspective view of a completed device 150. There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

Figure 1:
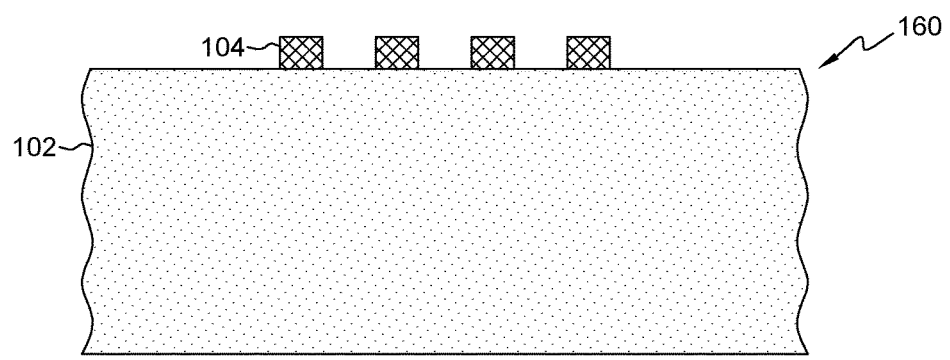
FIGS. 1-8 are schematic cross-sectional views of partially completed devices produced by methods herein.

Referring to FIG. 1, when creating such devices 160, methods herein provide a layer of semiconductor material 102 as a substrate, and then pattern a nitride hardmask on the semiconductor material 102 to leave hardmask elements 104. For purposes herein, a "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped.

Also, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

The hardmask 104 can be formed of any suitable material, whether now known or developed in the future, such as a nitride, metal, or organic hardmask, that has a hardness greater than the substrate and insulator materials used in the remainder of the structure; and, for example the hardmask 104 can be silicon nitride. Further, when patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

Figure 2:
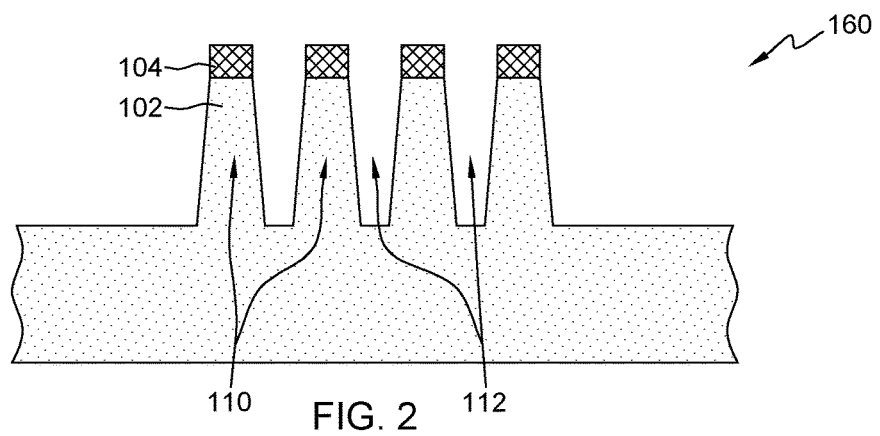

As shown in FIG. 2, such methods perform a first material removal process (listed above) to remove portions of the semiconductor material 102 not protected by the hardmask elements 104, and this patterns the semiconductor material 102 into fins, and leaves the hardmask elements 104 on the fins 110.

Figure 3:
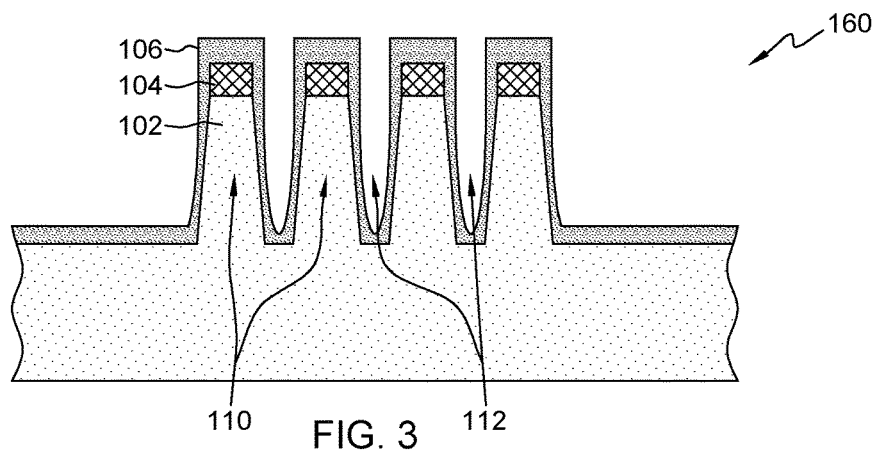

In FIG. 3, the methods herein also form a layer of silicon 106 on the hardmask elements 104 and the fins 110. The silicon 106 can be amorphous or crystalline silicon. Amorphous silicon (a-Si) is the non-crystalline form of silicon, and is different from crystalline forms of silicon, such as mono-crystalline or polycrystalline silicon (e.g., polysilicon). For example, the layer of silicon 106 can be formed in a physical vapor deposition (PVD) process, which is processing that forms the layer of silicon 106 relatively thicker on horizontal surfaces (e.g., surfaces parallel to the top of the substrate) and relatively thinner on non-horizontal surfaces (vertical surfaces that are perpendicular to the top of the substrate). Thus, the layer of silicon 106 is relatively thicker on the hardmask elements 104 (and relatively thinner on the sidewalls of the fins 110) because of the PVD processing. For example, the PVD process used in FIG. 3 can supply silicon as a vapor in a vacuum environment, to physically deposit the layer of silicon 106.

Figure 4:
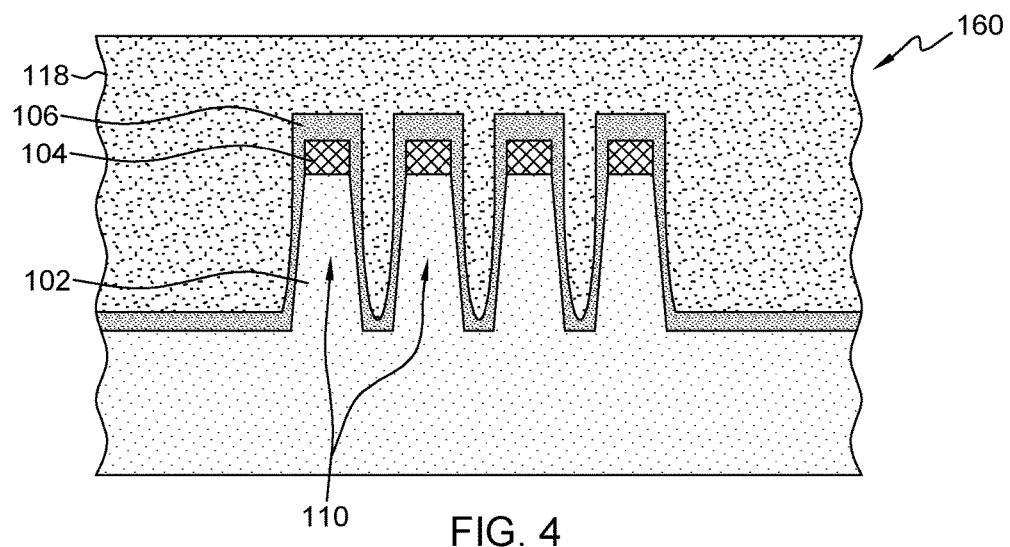

As shown in FIG. 4, such methods additionally deposit or grow an isolation material 118 (e.g., an insulator) on the layer of silicon 106. In one example, an oxide can be formed in a flowable chemical vapor deposition (FCVD). This leaves the isolation material 118 filling spaces between the fins 110. In this example, the isolation material 118 can be silicon dioxide.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam, and then patterned. Alternatively, the dielectrics herein may be formed from any of the many candidate high dielectric constant (high-k) materials, including but not limited to silicon nitride, silicon oxynitride, SiO2 and Si3N4, and metal oxides like tantalum oxide. The thickness of dielectrics herein may vary contingent upon the required device performance.

As shown in FIG. 5, the methods herein then perform an initial anneal that heats at least the isolation material 118 and the layer of silicon 106 (and generally the full structure 106) to consume relatively thinner portions of the layer of silicon 106 on the sidewalls of the fins 110, and this leaves the layer of silicon 106 only on the hardmask elements 104, and not on the fin sidewalls; and these are referred to herein as "silicon elements" 124.

As shown in FIG. 6, these methods perform chemical mechanical polishing (CMP) on the isolation material 118 to make the isolation material 118 planar with the silicon elements 124. During the CMP process, chemical agents are applied to the top of the partially formed structure, and abrasive elements contact the top of the partially formed structure to remove material therefrom. Also, the CMP process be occur in two steps, where the first step uses chemicals with a high selectivity and a high oxide polish rate slurry to remove most of the overburden oxide, and the second step uses a lower selectivity slurry.

These methods select the chemicals that are used in the CMP processing so that the silicon elements 124 have a greater CMP selectivity to the isolation material 118, relative to the CMP selectivity of the hardmask elements 104 to the isolation material 118. In this example, the chemicals used in the CMP processing can be, for example, metal oxide abrasives such as those of cerium oxide, zirconium oxide, titanium oxide, thorium oxide, etc.

Further, while the chemicals selected for use in the CMP processing attack the isolation material 118 at a faster rate than the chemicals would attack the hardmask elements 104, these chemicals selected attack the silicon elements 124 at an even slower rate than they would attack the hardmask elements 104. This allows the silicon elements 124 to remain in place during the CMP processing longer than the hardmask elements 104 would be able to remain during the otherwise same CMP processing, which means that the silicon elements 124 can protect the hardmask elements 104 even better than they would be able to protect themselves during the same CMP processing. Thus, the hardmask elements 124 are harder than the isolation material 118, and the silicon elements 124 are even harder than the hardmask elements 124, providing greater protection to the hardmask elements 124 alone.

Following the CMP, as shown in FIG. 7, such methods apply a first etching agent to strip (dissolve and remove) the silicon elements 124 on the hardmask elements 104. For example, metal etching using KOH (potassium hydroxide), Choline (Trimethyl Hydroxyethyl Ammonium Hydroxide), TMAH (Tetramethyl Ammonium Hydroxide, etc., can be used to remove the silicon elements.

The methods herein also perform a subsequent anneal with the hardmask elements 104 in place as shown in FIG. 7 to protect the fins 110, where the subsequent anneal increases the density of the isolation material 118. The subsequent anneal is performed at a temperature that is greater than the initial anneal that removed silicon from the fin sidewalls; and, for example, the second anneal can be conducted at a temperature that is 1.5×, 2×, 4×, 10×, etc., the temperature of the initial anneal. Again, silicon elements 124 acts as a buffer layer during STI CMP processing to protect the pad nitride hardmask 104 on top of the fin 110, and this avoids fin 110 exposure during subsequent high temperature anneals. Additionally, silicon elements 124 improve pad nitride 104 thickness uniformity by protecting the pad nitride 124 from over-polishing, which reduces fin height variation because the uniform thickness of all hardmask elements 124 keeps the height of all fins 110 the same.

The methods herein can optionally use a substrate that includes a buried oxide layer 100 (BOX) over which an upper silicon layer 101 is formed. The lower buried oxide layer 100 helps isolate the structures formed in the silicon layer 101 of the substrate. FIG. 8 also shows the option of a reduce height of (remove a portion of) the isolation material 118. For example, the fins can be protected, and a selective etch process that only attacks the isolation material 118 (see discussion above) can reduce the height. After such processing, these methods can apply a second chemical agent (e.g., hydrated in the presence of water) to dissolve and remove the hardmask elements 104 (the first etching agent can be different from the second chemical agent).

Figure 9:
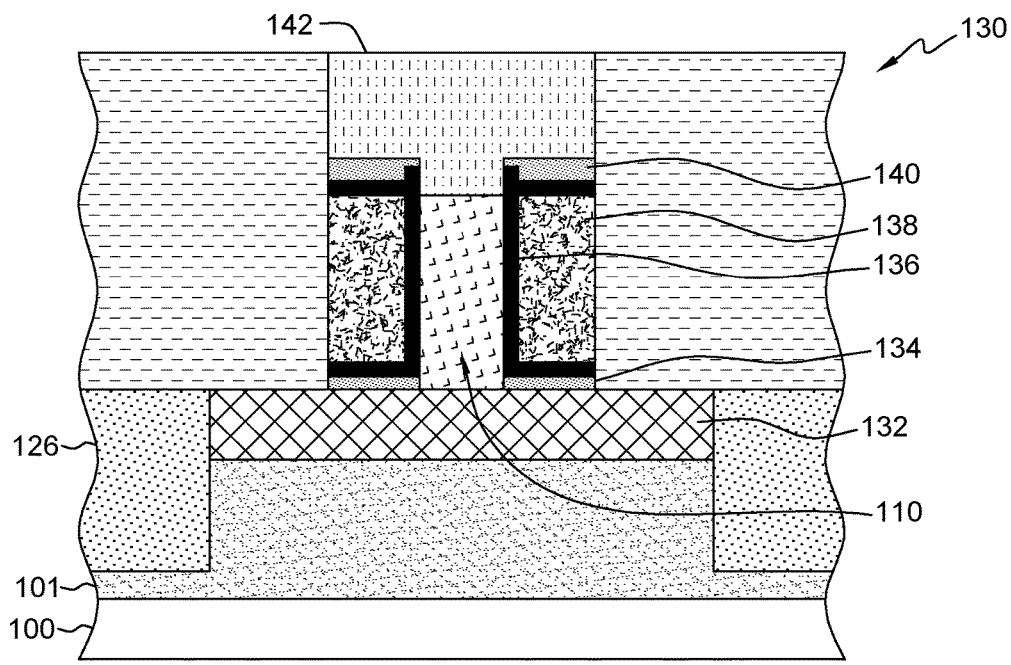
FIG. 9 is a schematic cross-sectional view of a completed device produced by methods herein.
Figure 10:
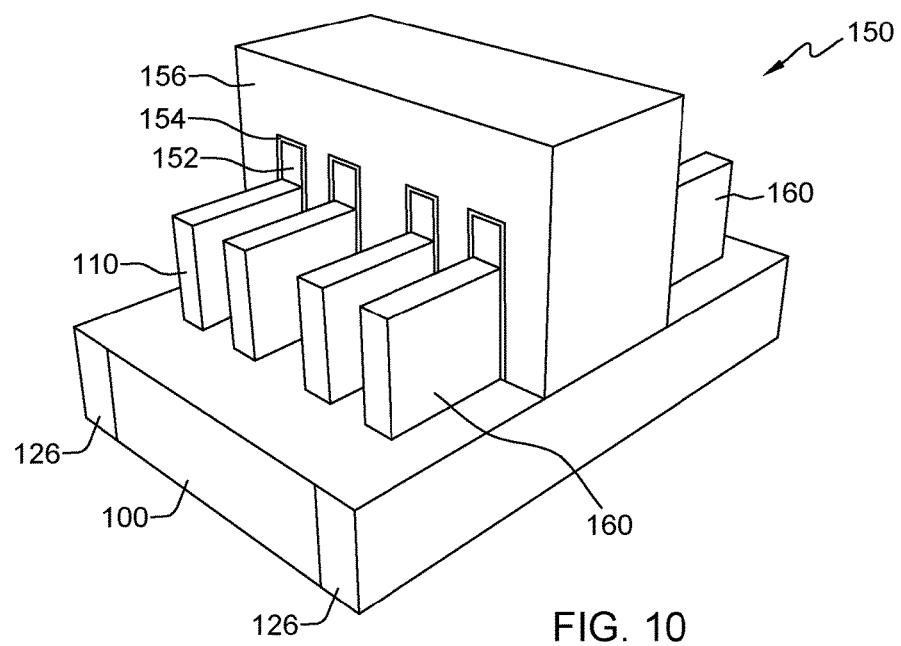
FIG. 10 is a schematic perspective view of a completed device produced by methods herein.

Starting with the structures shown in FIG. 7 or 8, such methods pattern a gate insulator and gate conductor on the fin to define a channel region of the fin where the gate insulator contacts the fin (the gate insulator is between the gate conductor and the channel region) and form source and drain regions adjacent the channel region, as shown in FIGS. 9 and 10.

For example, FIG. 9 illustrates a vertical field effect transistor (VFET) 130 that can be formed using the fins 110 and STI regions 126. Here a lower source/drain 132 is formed by dopant implantation into the upper substrate 101, a spacer 134 is deposited, a gate oxide 134 is grown on the fin 110, a gate conductor 138 is patterned around the fin 110, an upper spacer 140 is deposited, and an upper source/drain 142 is grown/deposited. Similarly, FIG. 10 illustrates a fin-type field effect transistor (FinFET) 150 formed using the fins 110 and STI regions 126. Here a gate insulator 154 is grown on the fin 110 and a fin cap 152 (which can be the hardmask elements 104), and a gate conductor 156 is formed over the fins 110. In FIG. 10, the ends of the fins 110 are doped to become source/drain regions 160. As is understood, such processing can be performed in an order different than that presented above.

Figure 11:
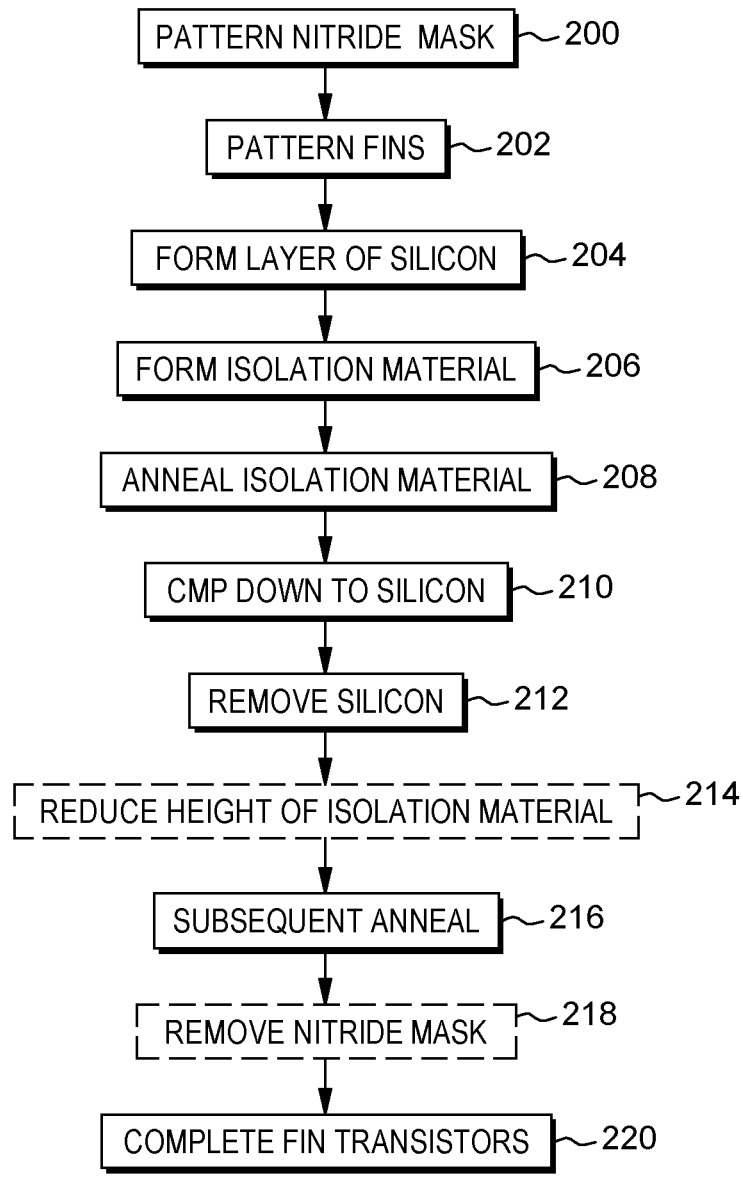
FIG. 11 is a flow diagram illustrating embodiments herein.

FIG. 11 shows such processing in flowchart form. More specifically, these methods provide a semiconductor material as a substrate, and pattern a nitride hardmask on the semiconductor material to leave hardmask elements in item 200. Such methods perform a first material removal process to remove portions of the semiconductor material not protected by the nitride hardmask in item 202, and this patterns the semiconductor material into fins, and leaves the hardmask elements on the fins.

The methods herein also form a layer of silicon on the hardmask elements and the fins in item 204. For example, the layer of silicon can be formed in a physical vapor deposition (PVD) process, which is processing that forms the layer of silicon thicker on the hardmask elements (and relatively thinner on the sidewalls of the fins). For example, the PVD process can supply silicon as a vapor in a vacuum environment, to physically deposit the layer of silicon.

Such methods additionally form an isolation material on the layer of silicon in item 206, and this leaves the isolation material filling spaces between the fins. The methods herein then anneal the isolation material and the layer of silicon to consume relatively thinner portions of the layer of silicon in item 208, and this leaves the layer of silicon only on the hardmask elements, and not on the fin sidewalls, as silicon elements.

These methods perform chemical mechanical polishing on the isolation material to make the isolation material planar with the silicon elements in item 210. During the CMP process, these methods select the chemicals for use in the CMP so that the silicon elements have a greater CMP selectivity to the isolation material relative to the CMP selectivity of the hardmask elements to the isolation material. Following the CMP, such methods apply a first etching agent to dissolve and remove the silicon elements on the hardmask elements, in item 212.

The methods herein can optionally reduce the height of (remove a portion of) the isolation material (e.g., in an etching process, etc.) in item 214, which uses dashed lines to show its optional nature. The methods herein also perform a subsequent, higher temperature anneal, with the hardmask elements in place to protect the fins, in item 216, where the subsequent anneal increases the density of the isolation material. After this, these methods can optionally apply a second chemical agent to dissolve and remove the hardmask elements (the first etching agent can be different from the second chemical agent) in item 218. Afterwards, such methods pattern a gate insulator and gate conductor on the fin to define a channel region of the fin where the gate insulator contacts the fin (the gate insulator is between the gate conductor and the channel region) and form source and drain regions adjacent the channel region in item 220.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
    patterning a hardmask on a first material to leave hardmask elements;
    patterning the first material into fins through the hardmask;
    forming a layer of silicon on the hardmask elements and the fins in processing that forms the layer of silicon thicker on the hardmask elements relative to the fins;
    forming an isolation material on the layer of silicon to leave the isolation material filling spaces between the fins;
    annealing the isolation material and the layer of silicon to consume relatively thinner portions of the layer of silicon and leave the layer of silicon on the hardmask elements as silicon elements;
    performing chemical mechanical polishing (CMP) on the isolation material to make the isolation material planar with the silicon elements;
    applying a first etching agent to dissolve and remove the silicon elements on the hardmask elements; and
    applying a second chemical agent to dissolve and remove the hardmask elements.

2. The method according to claim 1, further comprising selecting chemicals for use in the CMP so that the silicon elements have a greater CMP selectivity to the isolation material relative to CMP selectivity of the hardmask elements to the isolation material.

3. The method according to claim 1, wherein the first etching agent is different from the second chemical agent.

4. The method according to claim 1, further comprising performing a subsequent anneal with the hardmask elements in place to protect the fins, wherein the subsequent anneal increases density of the isolation material.

5. The method according to claim 1, wherein the isolation material comprises an oxide.

6. The method according to claim 1, wherein forming the layer of silicon comprises a physical vapor deposition (PVD) process.

7. The method according to claim 6, wherein the PVD process supplies silicon as a vapor in a vacuum environment to physically deposit the layer of silicon.

8. A method comprising:
    providing a semiconductor material;
    patterning a nitride hardmask on the semiconductor material to leave hardmask elements;
    performing a first material removal process to remove portions of the semiconductor material not protected by the nitride hardmask to pattern the semiconductor material into fins, and leave the hardmask elements on the fins;
    forming a layer of silicon on the hardmask elements and the fins in processing that forms the layer of silicon thicker on the hardmask elements relative to the fins;

forming an isolation material on the layer of silicon to leave the isolation material filling spaces between the fins;

performing an initial anneal to consume relatively thinner portions of the layer of silicon and leave the layer of silicon on the hardmask elements as silicon elements;

performing chemical mechanical polishing (CMP) on the isolation material to make the isolation material planar with the silicon elements;

applying a first etching agent to dissolve and remove the silicon elements on the hardmask elements;

performing a subsequent anneal with the hardmask elements in place to protect the fins; and applying a second chemical agent to dissolve and remove the hardmask elements.

9. The method according to claim 8, further comprising selecting chemicals for use in the CMP so that the silicon elements have a greater CMP selectivity to the isolation material relative to CMP selectivity of the hardmask elements to the isolation material.

10. The method according to claim 8, wherein the first etching agent is different from the second chemical agent.

11. The method according to claim 8, wherein the subsequent anneal increases density of the isolation material.

12. The method according to claim 8, wherein the isolation material comprises an oxide.

13. The method according to claim 8, wherein forming the layer of silicon comprises a physical vapor deposition (PVD) process.

14. The method according to claim 13, wherein the PVD process supplies silicon as a vapor in a vacuum environment to physically deposit the layer of silicon.

15. A method comprising:

providing a semiconductor material;

patterning a nitride hardmask on the semiconductor material to leave hardmask elements;

performing a first material removal process to remove portions of the semiconductor material not protected by the nitride hardmask to pattern the semiconductor material into fins, and leave the hardmask elements on the fins;

forming a layer of silicon on the hardmask elements and the fins in processing that forms the layer of silicon thicker on the hardmask elements relative to the fins;

forming an isolation material on the layer of silicon to leave the isolation material filling spaces between the fins;

performing an initial anneal to consume relatively thinner portions of the layer of silicon and leave the layer of silicon on the hardmask elements as silicon elements;

performing chemical mechanical polishing (CMP) on the isolation material to make the isolation material planar with the silicon elements;

applying a first etching agent to dissolve and remove the silicon elements on the hardmask elements;

performing a subsequent anneal with the hardmask elements in place to protect the fins;

applying a second chemical agent to dissolve and remove the hardmask elements;

removing a portion of the isolation material;

patterning a gate insulator and gate conductor on the fin to define a channel region of the fin where the gate insulator contacts the fin, wherein the gate insulator is between the gate conductor and the channel region; and forming source and drain regions adjacent the channel region.

16. The method according to claim 15, further comprising selecting chemicals for use in the CMP so that the silicon elements have a greater CMP selectivity to the isolation material relative to CMP selectivity of the hardmask elements to the isolation material.

17. The method according to claim 15, wherein the first etching agent is different from the second chemical agent.

18. The method according to claim 15, wherein the subsequent anneal increases density of the isolation material.

19. The method according to claim 15, wherein forming the layer of silicon comprises a physical vapor deposition (PVD) process.

20. The method according to claim 19, wherein the PVD process supplies silicon as a vapor in a vacuum environment to physically deposit the layer of silicon.

* * * * *